(12) United States Patent
Sano

(10) Patent No.: US 7,881,056 B2
(45) Date of Patent: Feb. 1, 2011

(54) HEAT RADIATION STRUCTURE FOR AN ELECTRONIC DEVICE

(75) Inventor: Tetsuo Sano, Kobe (JP)

(73) Assignee: Fujitsu Ten, Kobe-shi (JP)

( * ) Notice: Subject to any disclaimer, the term of this patent is extended or adjusted under 35 U.S.C. 154(b) by 235 days.

(21) Appl. No.: 11/987,634

(22) Filed: Dec. 3, 2007

(65) Prior Publication Data

US 2008/0130235 A1 Jun. 5, 2008

(30) Foreign Application Priority Data

Dec. 4, 2006 (JP) .............................. 2006-327567

(51) Int. Cl.
*H05K 7/20* (2006.01)
*H05K 5/00* (2006.01)
*A47B 77/08* (2006.01)

(52) U.S. Cl. .................. 361/695; 361/679.48; 361/692; 361/719; 454/184; 312/236; 165/80.2; 174/17 VA; 174/547

(58) Field of Classification Search ............ 361/679.48, 361/690, 695, 719, 692–693; 454/184; 312/236
See application file for complete search history.

(56) References Cited

U.S. PATENT DOCUMENTS 6,735,079 B2 * 5/2004 Huang ..................... 361/695
2008/0212285 A1 * 9/2008 Sun ........................ 361/710

FOREIGN PATENT DOCUMENTS

| JP | U-58-109256 | 7/1983 |
| JP | A-09-008483 | 1/1997 |
| JP | A 2001-291806 | 10/2001 |
| JP | A 2004-349560 | 12/2004 |

* cited by examiner

*Primary Examiner*—Zachary M Pape
(74) *Attorney, Agent, or Firm*—Oliff & Berridge, PLC

(57) ABSTRACT

The heat sink is provided perpendicularly to a bottom of a case of an on-board information device as the electronic device and adjacent to a right side plate of the case having windows (104) and (105). The heat sink includes grooves each vertically extending from the first to the third heat generating elements at a lower portion upward, and the through holes formed at positions corresponding to the windows of the right side plate of the case and at the upper portion of the heat sink along the grooves.

5 Claims, 11 Drawing Sheets

HEAT RADIATION STRUCTURE FOR AN ELECTRONIC DEVICE

INCORPORATION BY REFERENCE

The disclosure of Japanese Patent Application No. 2006-327567 filed on Dec. 4, 2006 including the specification, drawings and abstract is incorporated herein by reference in its entirety.

BACKGROUND OF THE INVENTION

1. Field of the Invention

The invention relates to an electronic device which radiates heat generated by a heat generating element outside a case.

2. Description of the Related Art

The case structured to radiate the heat generated by the heat generating element in the case and the heat sink have been well known. The heat sink having the structure with increased volume or surface area, or the flat structure having the surface in contact with the case further brought into tight contact therewith so as to improve the radiating effect has been known.

Japanese Patent Application Publication No. 2004-349560 discloses the electronic device with cooling system having heat generating components thermally connected to the inner surface of the wall of the case for forming the electronic device, and vent holes formed in the wall of the case around the heat generating components.

Japanese Patent Application Publication No. 2001-291806 discloses the process for radiating heat of the CPU in the laptop personal computer to the outside through the heat sink having one end attached to the surface of the CPU. The heat sink has parallely arranged plural grooves for radiation along the heat generation direction.

The electronic device with cooling system disclosed in the former patent document has the vent holes formed on the bottom of the case. The air (heat) warmed by the heat generating component rises, which is likely to be remained inside the electronic device with cooling system. The air warmed by the heat generating component is not directly radiated outside the device, which is likely to cause the heat to be remained inside the device.

In the latter patent document, the heat of the CPU disposed at the center of the laptop personal computer is radiated through the opening formed in the outer wall of the personal computer with the metal plate (heat sink) extending in the lateral direction. With the aforementioned structure, however, the air warmed by the CPU is not directly radiated outside the device, which is likely to cause the heat to be remained inside the personal computer. As the laptop personal computer has been demanded to be thin (2 to 3 cm thick, for example) by the user, the use of the heat sink for connecting the CPU and the opening of the outer wall of the personal computer may be appropriate. The above disclosed structure may cause the heat to be remained inside the device having the thickness exceeding 3 cm, for example.

SUMMARY OF THE INVENTION

It is an object of the invention to provide an electronic device structured to easily radiate heat generated by the heat generating element outside the case.

According to the invention, an electronic device includes a heat generating element disposed on a substrate, and a radiation member disposed perpendicularly to a bottom of a case and adjacent to a side plate of the case having a vent hole, which includes a groove vertically extending upward from a lower portion, and a through hole formed in a position corresponding to the vent hole of the side plate of the case and at the upper portion along the groove. The radiation member is provided such that one of the groove and the through hole is provided above the heat generating element.

In the aforementioned structure, the heat generated by the heat generating element is guided to the through hole along the groove so as to be easily radiated outside the case.

As described above, the heat generated by the heat generating element is guided toward the through hole along the groove so as to be easily released outside the case.

DETAILED DESCRIPTION OF THE PREFERRED EMBODIMENTS

Figure 1:
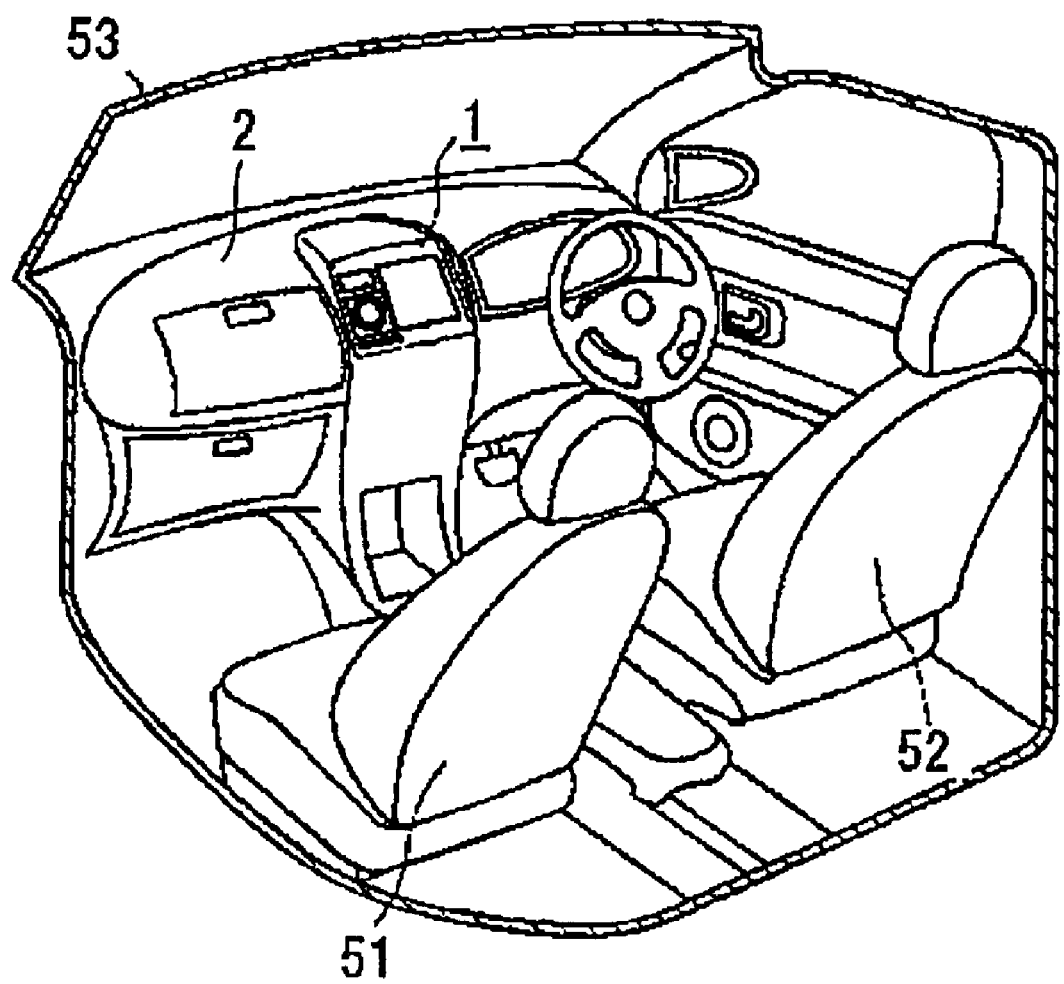
FIG. 1 is a perspective view showing an example where an electronic device of an embodiment according to the invention is installed in a vehicle.

An embodiment according to the invention will be described referring to the drawings.

FIG. 1 is a perspective view showing an example where the electronic device of the embodiment according to the invention is installed in the vehicle.

The drawing shows a passenger seat 51, a driver seat 52, a windshield 53, and an on-board information device 1 serving as an electronic device. The on-board information device 1 is equipped with a car navigation unit, an audio unit, a tuner, and the like, for example.

The on-board information device 1 is in tight fit with the front instrument panel 2 at the center to the front of the passenger seat 51 and the driver seat 52. As the on-board information device is in the air-tight state, heat generated by various kinds of heat generating elements disposed inside the on-board information device 1 is likely to remain.

Figure 2:
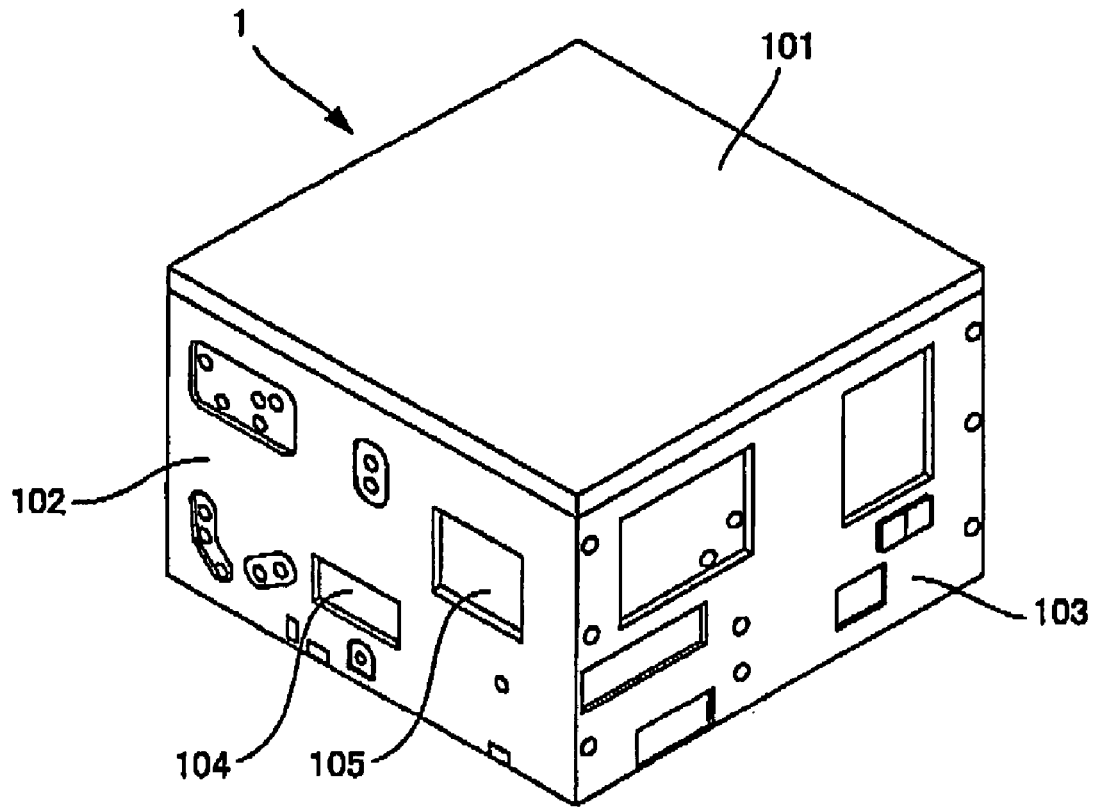
FIG. 2 is a rear perspective view of an appearance of an on-board information device as the electronic device including the radiation member.

FIG. 2 is a rear perspective view of the appearance of the on-board information device 1 including the radiation member.

Referring to the drawing, the on-board information device 1 includes a box-like case formed of a top plate 101, a right side plate 102, and a back plate 103. The back plate 103 has an inlet formed therein to allow insertion of the power source and the cable. The right side plate 102 has windows 104 and 105 through which the protrusion of the heat sink to be described later is exposed. Those windows 104 and 105 are formed to radiate the heat remained inside the case to the outside.

Figure 3:
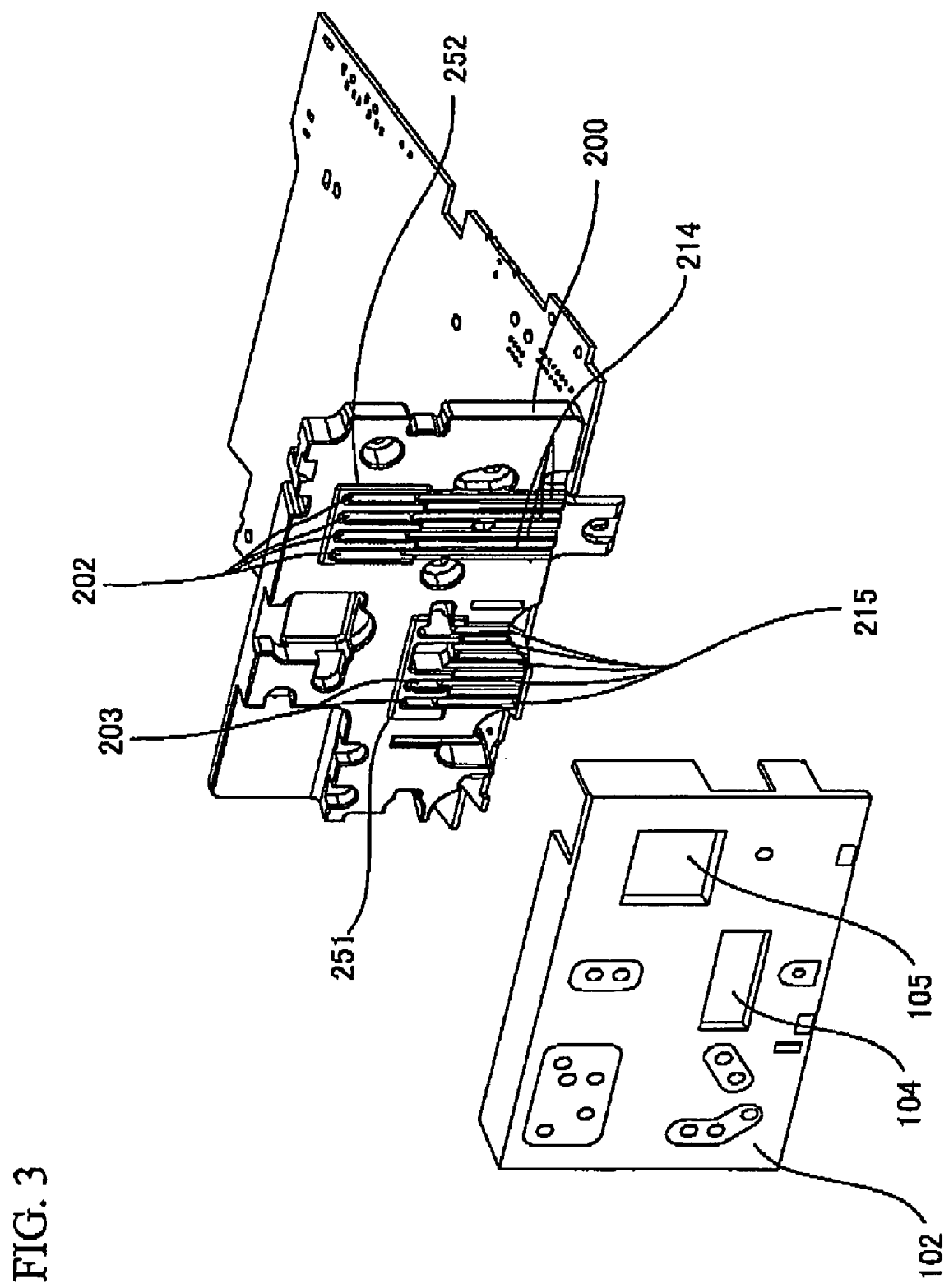
FIG. 3 is a view showing a positional relationship between a right side plate of a case and a heat sink.

FIG. 3 is a view showing the positional relationship between the right side plate 102 and the heat sink.

Referring to the drawing, the heat sink 200 is formed of a highly thermal conductive material, for example, aluminum, copper and the like. A back surface of the heat sink 200 includes convex portions 251 and 252 which are fit with the windows 104 and 105 formed in the right side plate 102 so as to be in contact with the outer atmosphere. As described later, a plurality of through holes 203 are formed in the convex portion 251, and a plurality of grooves 215 are formed perpendicularly from the through holes 202 to the lower portion of the heat sink 200. A plurality of through holes 202 are formed in the convex portion 252, and a plurality of grooves 214 are formed perpendicularly from the through holes 202 to the lower portion of the heat sink 200.

Figure 4:
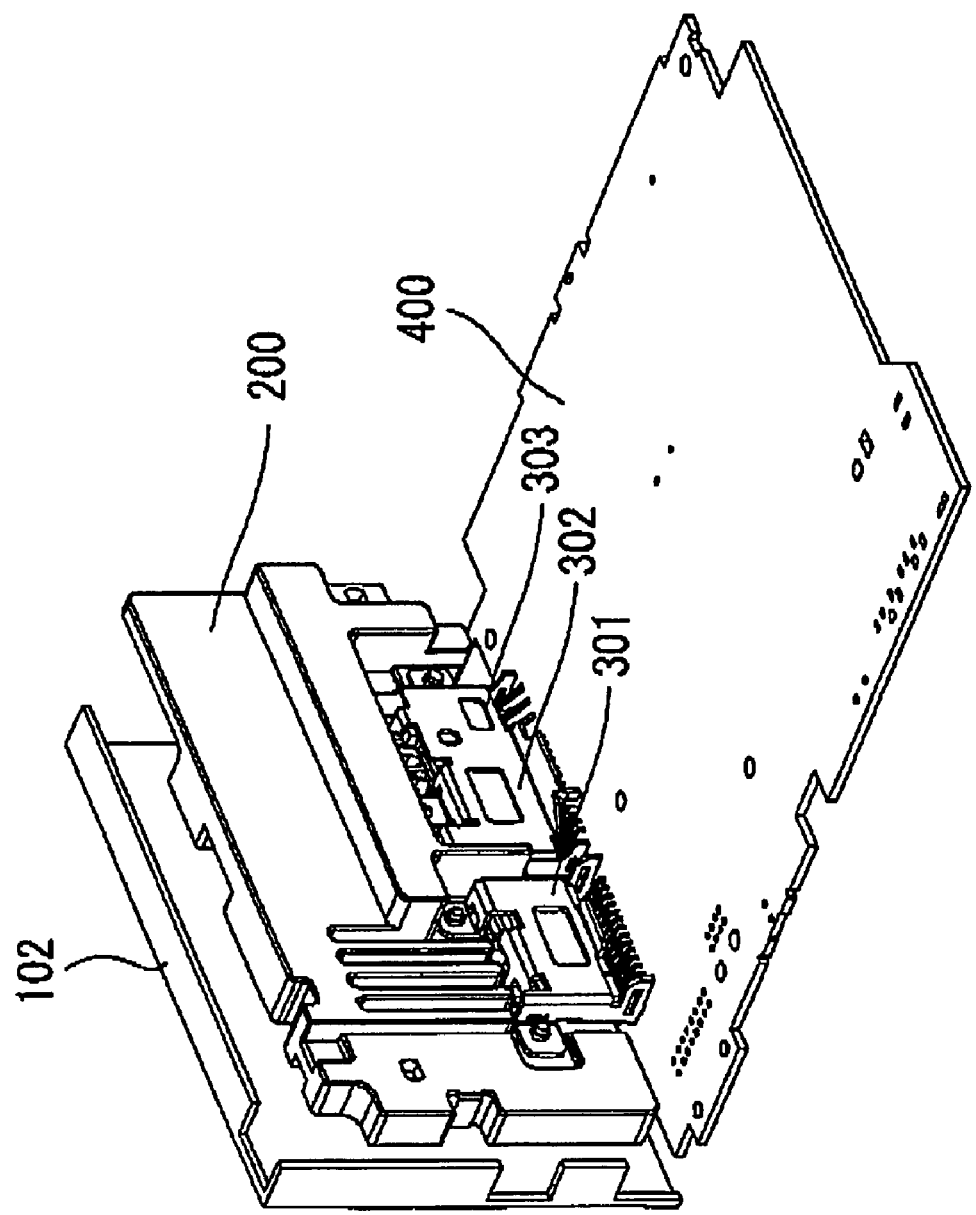
FIG. 4 is a view showing the state where heat generating elements are disposed on a surface of the heat sink and a substrate.

FIG. 4 is a view showing the state where the heat generating elements are formed on a surface of the heat sink 200 and a substrate.

Referring to FIG. 4, the heat sink 200 is disposed to the right end of a substrate 400, which is adjacent to the right side plate 102 of the case and perpendicular to the substrate 400 or the bottom of the case (not shown).

A first heat generating element 301, a second heat generating element 302 and a third heat generating element 303 are adhered at the lower portion of the heat sink 200 with a silicon adhesive agent, for example, and further screwed. Each of the first, second, and third heat generating elements 301, 302 and 303 has a plurality of legs soldered to the substrate 400 as shown in FIG. 4.

Each of the first, the second, and the third heat generating elements 301, 302 and 303 is formed as a power IC, a system regulator, or a regulator.

Figure 5C:
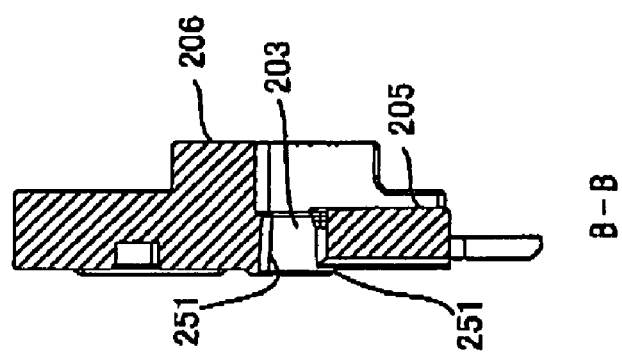
FIG. 5C is a cross section taken along line B-B of FIG. 5A.
Figure 5B:
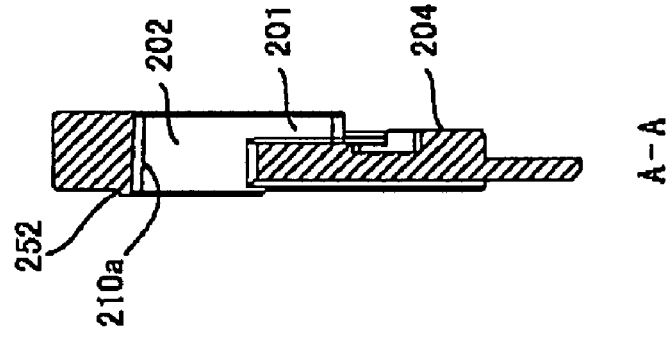
FIG. 5B is a cross section taken along line A-A of FIG. 5A.
Figure 5A:
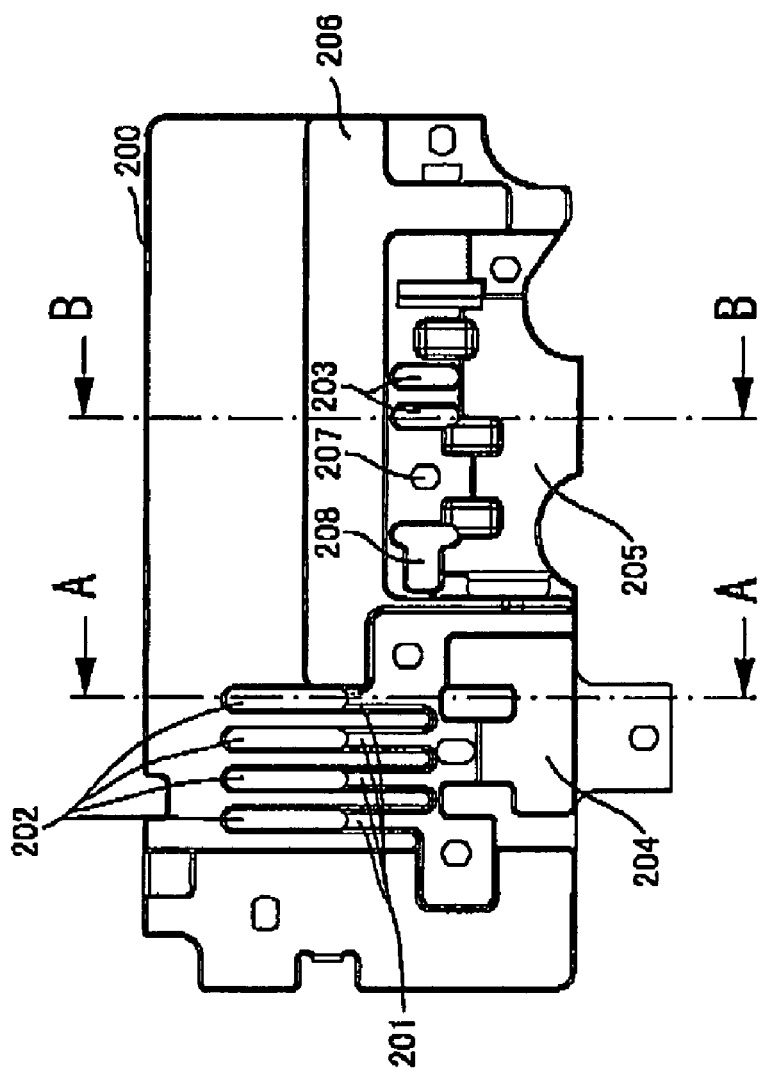
FIG. 5A is a view showing the surface structure of the heat sink.

FIG. 5A shows a structure of the surface of the heat sink 200. FIG. 5B is a cross section taken along line A-A shown in FIG. 5A. FIG. 5C is a cross section taken along line B-B shown in FIG. 5A.

Referring to FIG. 5A, the heat sink 200 includes a first area 204 at the lower portion for accommodating the first heat generating element to be mounted, grooves 201 each vertically extending from the heat generating elements upward of the heat sink, and through holes 202 each formed at the position corresponding to the window 105 of the right side plate 102 of the case and above the radiation member along the grooves 201. The heat sink 200 further includes a second area 205 at the lower portion for accommodating the second and the third heat generating elements to be mounted, through holes 203 formed at the position corresponding to the window 104 of the right side plate 102 of the case for radiating the heat from the second and the third heat generating elements outside the case, a protrusion 206 which guides the heat to rise from the second and the third heat generating elements toward the through holes 203 while preventing the heat from releasing upward, a screw hole 207 through which the second or the third heat generating element is screwed, and a through hole 208 for cable wiring.

The through holes 202 are formed at the position corresponding to the convex portion 252, that is, a plurality of through holes are formed on the convex portion 252 when viewed from back surface of the heat sink 200. The plurality of the through holes 202 are slit-like arranged. Plural through holes 203, 208, and the screw hole 207 are formed at the position corresponding to the convex portion 251. The plural grooves 201 are also formed in the heat sink 200, which are slit-like arranged.

The grooves 201 are formed above the first heat generating element, and functions in guiding the heat generated by the first heat generating element to the through holes 202 with the chimney effect. The through holes 202 function in directly radiating the heat generated by the first heat generating element outside the case. The through holes 203 and 208 function in directly radiating the heat generated by the second and the third heat generating elements outside the case.

Referring to FIG. 5B, a top portion 210a of the through hole 202 is sloped such that the inner diameter of the through hole 202 is increased from the inside to the outside the case. Referring to FIG. 5C, a top portion of the through hole 203 is also sloped such that the inner diameter of the through hole 203 is increased from the inside to the outside the case. The aforementioned gradients of the top portions formed in the through holes 202 and 203 may guide the heat to the outside the case along the gradient. This makes it possible to easily radiate the heat generated by the heat generating element outside the case.

In the aforementioned case, the top portion 210a of the through hole 202 and the top portion of the through hole 203 are only sloped. However, any gradient may be made for the inner peripheral surfaces of the through holes 202 and 203 such that the inner diameters of the through holes 202 and 203 are increased from the inside to the outside the case. This makes it possible to easily radiate the heat generated by the heat generating element outside the case.

Figure 6:
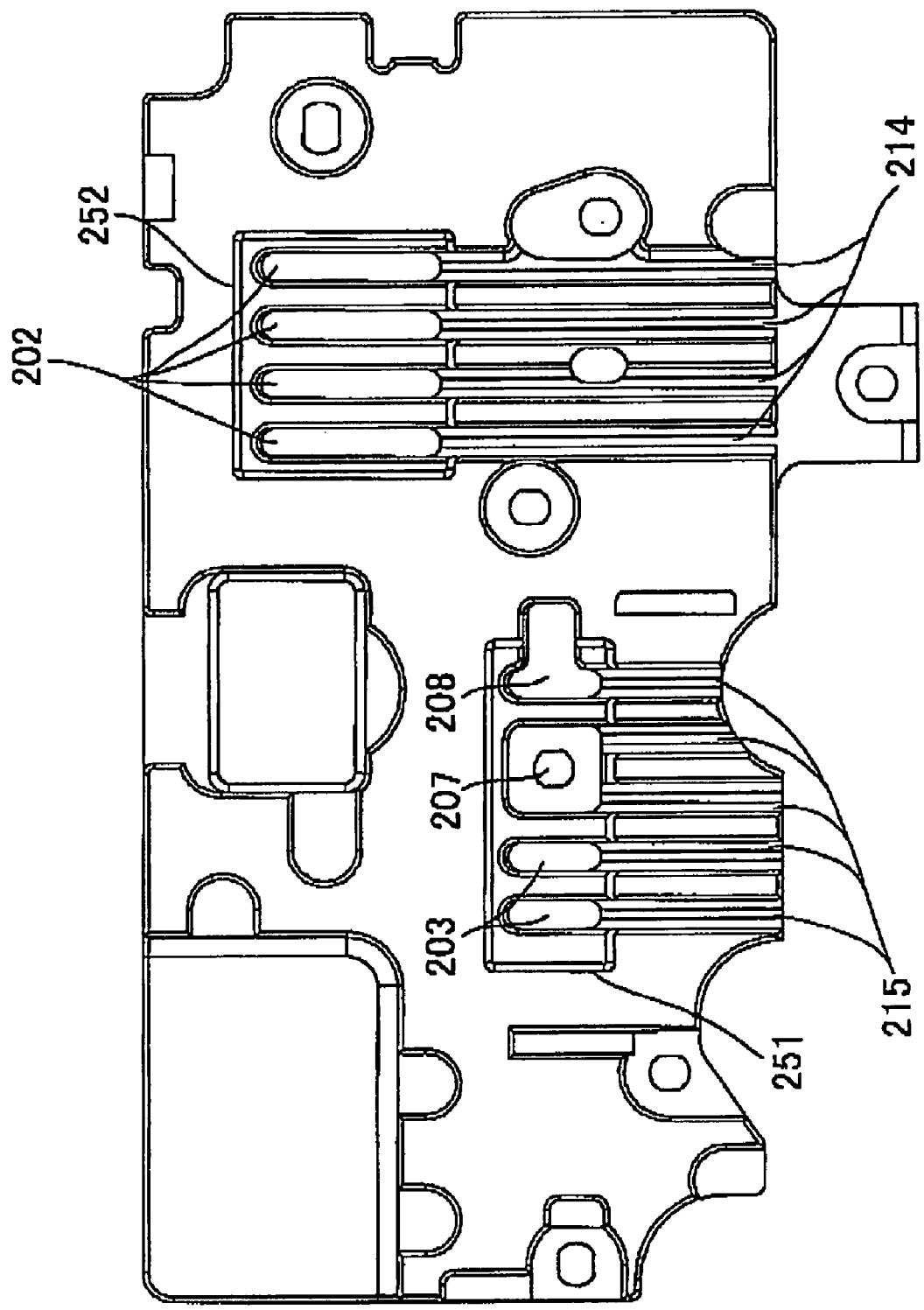
FIG. 6 is a view showing a structure of a back surface of the heat sink.

FIG. 6 shows a structure of a back surface of the heat sink 200.

The convex portions 252 and 251 are formed on the back surface of the heat sink 200. The through holes 202 and 203 are formed in the convex portions 252 and 251, respectively. Referring to the drawing, the plural grooves 214 and 215 vertically extending from the bottom of the heat sink 200 to the through holes 202 and 203 are formed in the back surface of the heat sink 200.

Heat generated by the heat generating element is also conducted to the back surface of the heat sink 200, and air present in a small space between the back surface of the heat sink 200 and the right side plate 102 is warmed and becomes hot air. The grooves 214 and 215 are thus formed on the back surface of the heat sink 200, to which no heat generating element is directly attached, in order to efficiently radiate such heat to outside the case.

Figure 7B:
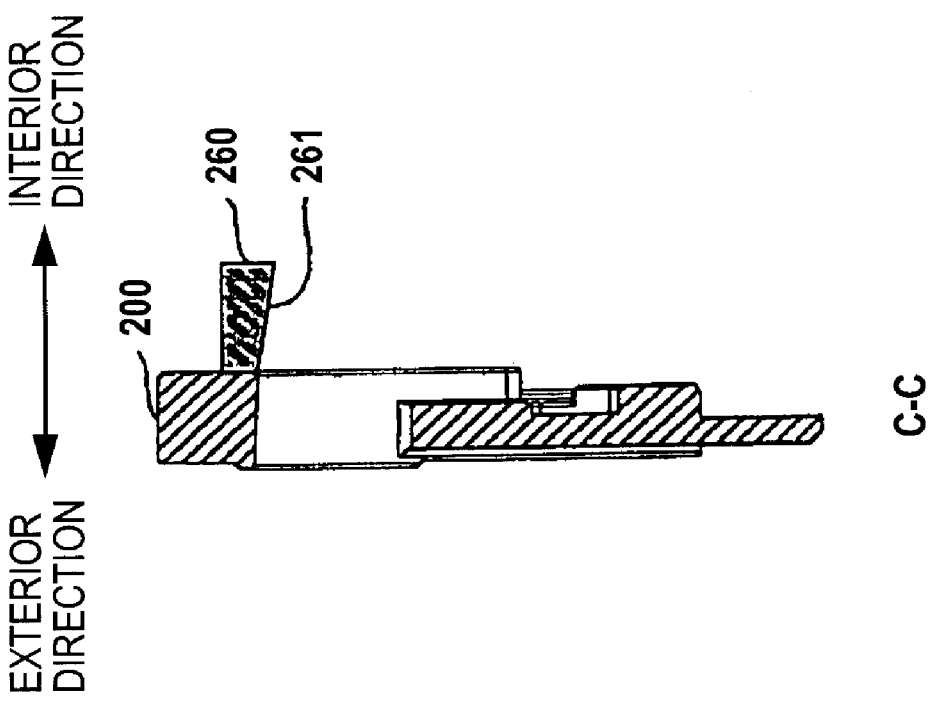
FIG. 7B is a cross section taken along line C-C shown in FIG. 7A.
Figure 7A:
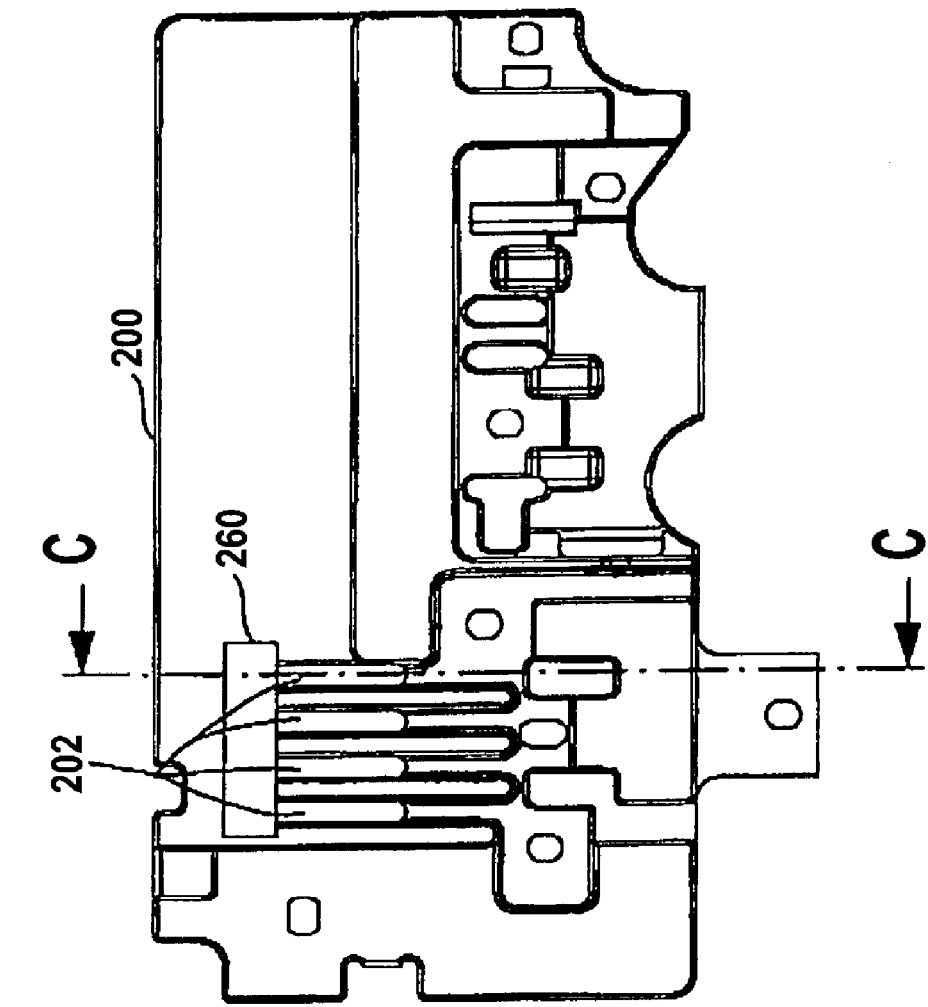
FIG. 7A shows a structure of a surface of the heat sink as a modified example.
Figure 8:
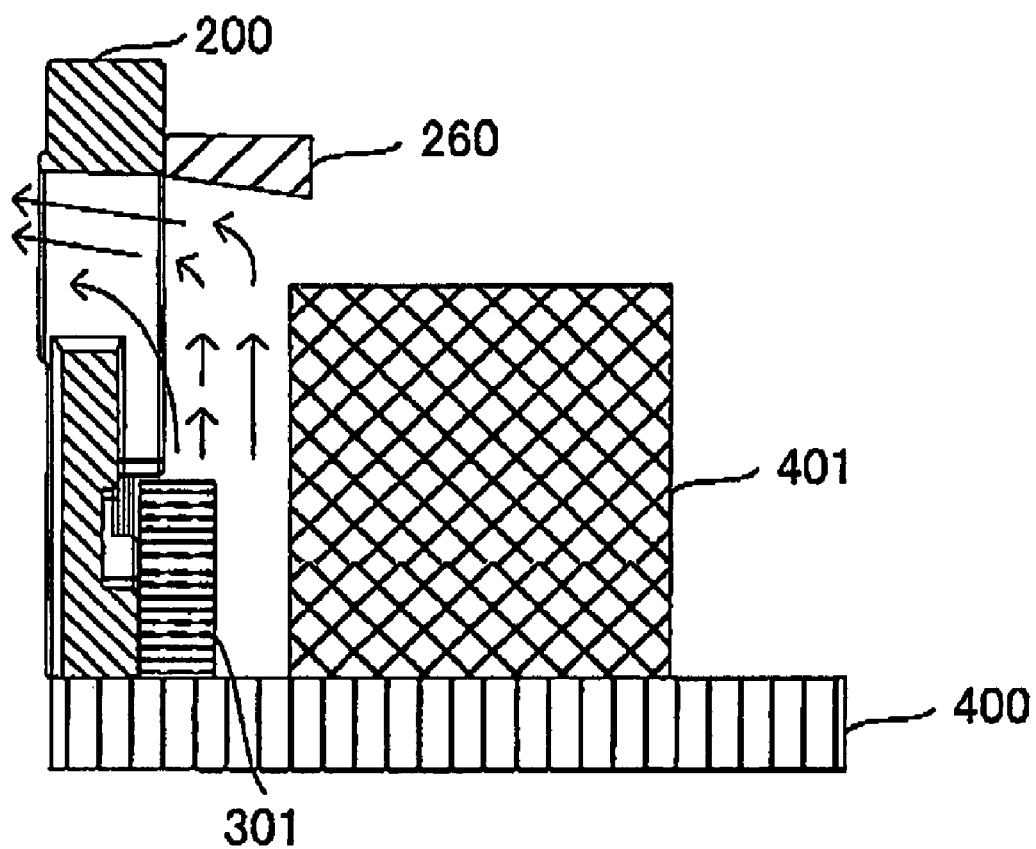
FIG. 8 is a schematic view showing the flow of the heat generated by the first heat generating element.

FIG. 7A shows a structure of the surface of the heat sink 200 as a modified example. FIG. 7B is a cross section taken along line C-C of FIG. 7A. FIG. 8 is a view schematically showing the flow of the heat generated by the first heat generating element 301.

Referring to FIG. 7A, a visor-like protrusion 260 is provided above the through holes 202 on the surface of the heat sink 200. Referring to FIG. 7B, a bottom 261 of the protrusion 260 is sloped to rise from the inside to the outside the case. The protrusion 260 is formed separately from the heat sink 200, which is fixed to the top portion of the through holes 202 with adhesion, welding, soldering, or screwing. Alternatively, the protrusion 260 may be formed integrally with the heat sink 200 through the press working.

FIG. 8 shows a device 401 built in the on-board information device 1, for example, an audio unit, a tuner and the like. The device 401 is disposed on the substrate 400 adjacent to the heat sink 200.

As described above, the visor-like protrusion 260 is provided above the through holes 202. The bottom 261 of the protrusion 260 is sloped to rise from the inside to the outside the case. Referring to FIG. 8, the heat generated by the first heat generating element 301 rises to impinge against the bottom 261 of the protrusion 260, and is guided by the through holes 202 so as to be efficiently radiated outside the case.

Figure 9:
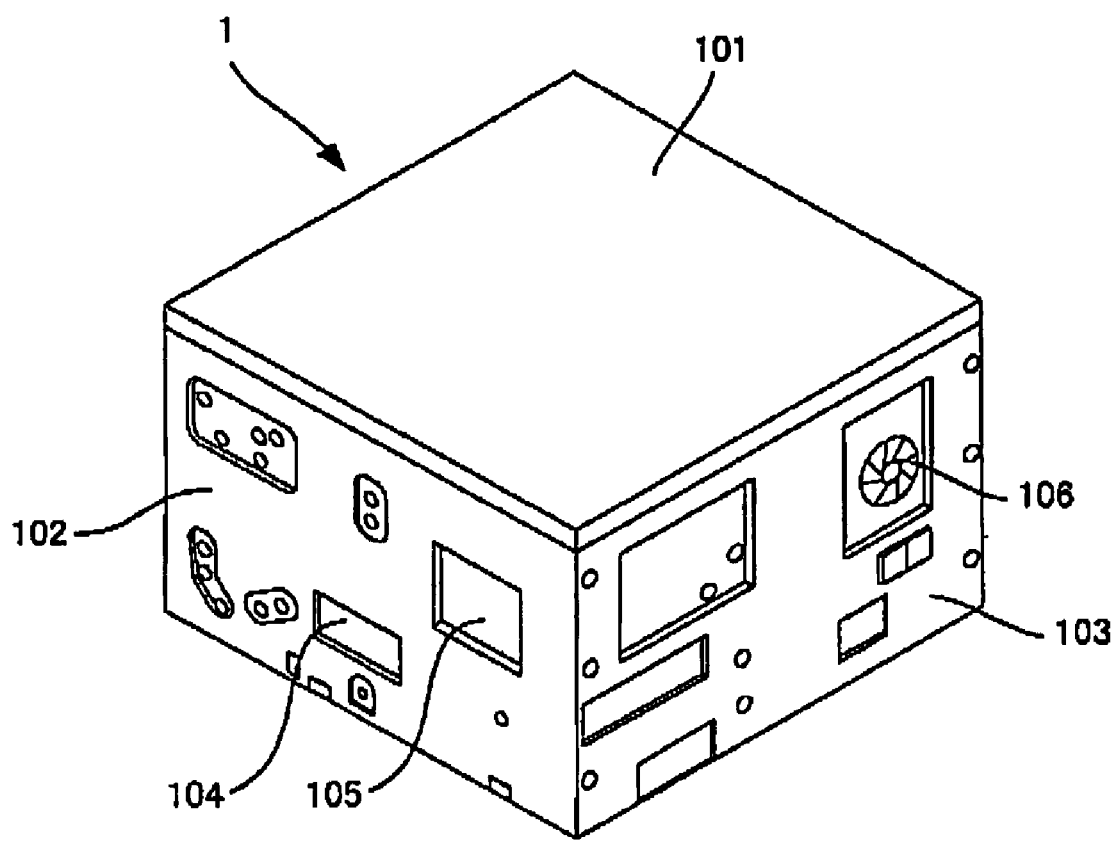
FIG. 9 is a perspective view showing a modified example of the on-board information device shown in FIG. 2
Figure 10:
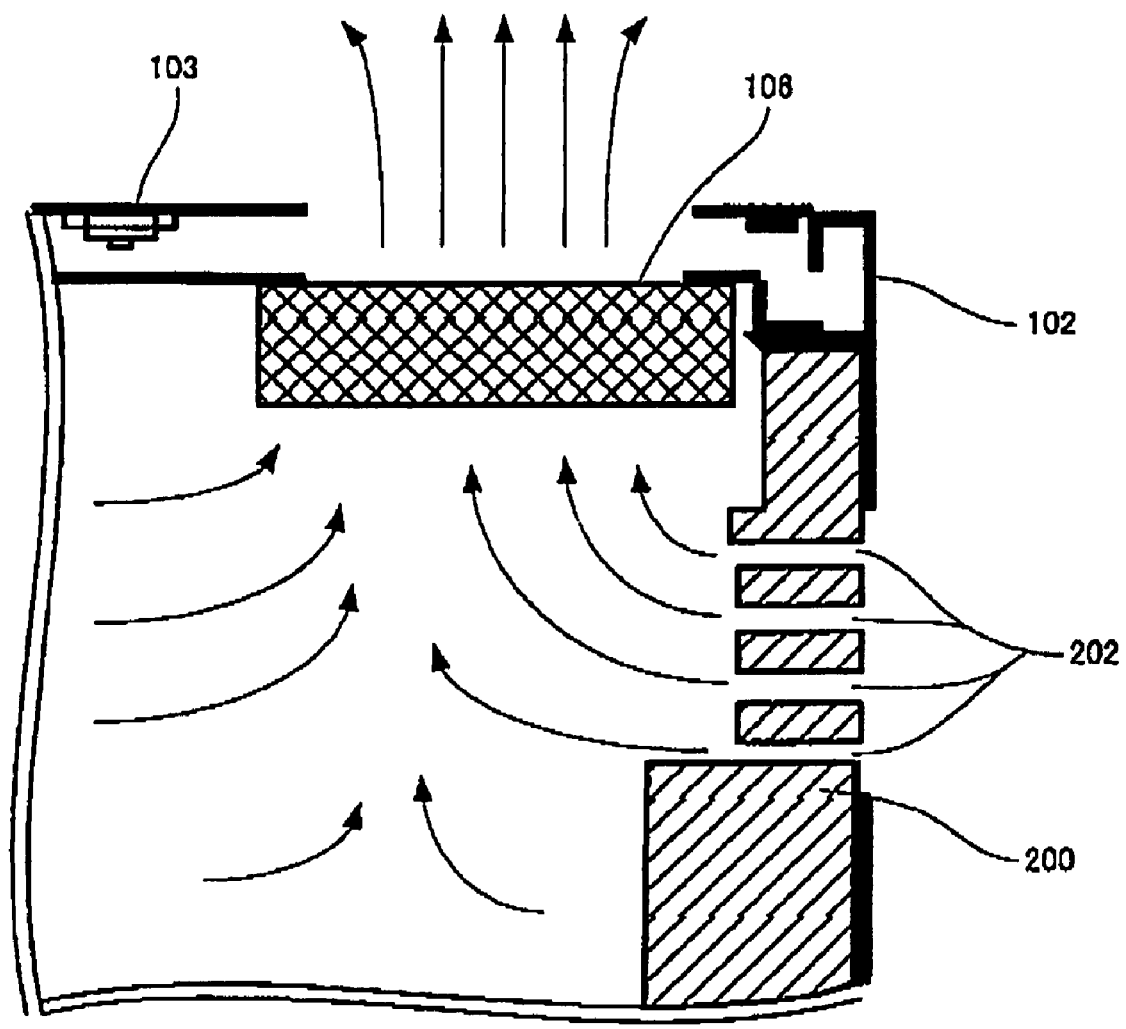
FIG. 10 is a partial cross section of the on-board information device shown in FIG. 9.

FIG. 9 is a perspective view showing the modified example of the on-board information device 1 shown in FIG. 2. FIG. 10 is a partial cross section of the on-board information device shown in FIG. 9, representing the flow of air within the device.

The structure of the on-board information device shown in FIG. 9 is different from the one shown in FIG. 2 in that a cooling fan 106 is provided at the upper portion of the back plate 103 for efficiently radiating the heat outside the case.

In the aforementioned case, the heat that remains inside the case is radiated through the cooling fan 106 outside the case as shown in FIG. 10. As the through holes 202 and 203 are formed in the heat sink 200 in addition to the cooling fan 106, air within the case is likely to circulate or convect, thus allowing efficient cooling of the heat sink 200.

A plurality of cooling fans may be installed in the case rather than the use of the single cooling fan such that the air within the case may further be likely to circulate or convect.

Referring to FIG. 9, the cooling fan 106 is provided at the upper portion of the back plate 103. However, the cooling fan may be provided at the left side plate of the case. The cooling fan 106 may be installed at any position so long as the circulation or convection of air within the case is likely to occur.

According to the embodiment, the heat sink 200 is provided perpendicularly to the bottom of the case of the on-board information device 1, and arranged adjacent to the right side plate 102 of the case having the windows 104 and 105. The heat sink 200 includes the grooves 201, 214 and 215 each vertically extending to the upper portion of the heat sink 200 from the first to the third heat generating elements at the lower portion of the heat sink 200, and the through holes 202 and 203 formed at the positions corresponding to the windows 104 and 105 of the right side plate 102 of the case and at the upper portion of the heat sink 200 along the grooves 201, 214, and 215. The heat generated by the first to the third heat generating elements is guided through the through holes 202 and 203 along the grooves 201, 214 and 215 so as to be easily radiated outside the case.

As the through holes 202 and 203 are formed in the heat sink 200, its weight may be reduced. As the grooves 201, 214 and 215 are formed in the heat sink 200, its surface area of the heat sink 200 is increased to improve the radiating effect of the heat sink 200.

The heat sink 200 includes the convex portions 251 and 252 which are fit with the windows 104 and 105 formed in the right side plate 102 of the case. The through holes 202 and 203 are formed in the convex portions 252 and 251, respectively. This makes it possible to radiate the heat generated by the first to the third heat generating elements outside the case.

The cooling fan may be directly attached to each of the first to the third heat generating elements for the purpose of suppressing the heat generation.

In the aforementioned embodiment, the heat sink 200 is arranged adjacent to the right side plate 102 of the case. However, it is not limited to the aforementioned structure. For example, the heat sink 200 may be arranged adjacent to the left side plate. In this case, the heat sink 200 and the left side plate are structured such that the convex portions 251 and 252 formed on the back surface of the heat sink 200 are fit with two windows formed in the left side plate of the case.

A vent hole may be formed in the top plate 101 of the case for the purpose of efficiently radiating the heat outside the case. In this structure where the vent hole is formed in the top plate 101 of the case above the first to the third heat generating elements, the heat may further be efficiently radiated outside the case.

Each cross section of the grooves 201, 214 and 215 may be formed into the curved U-like shape, block U-like shape, and the V-like shape.

Figure 11:
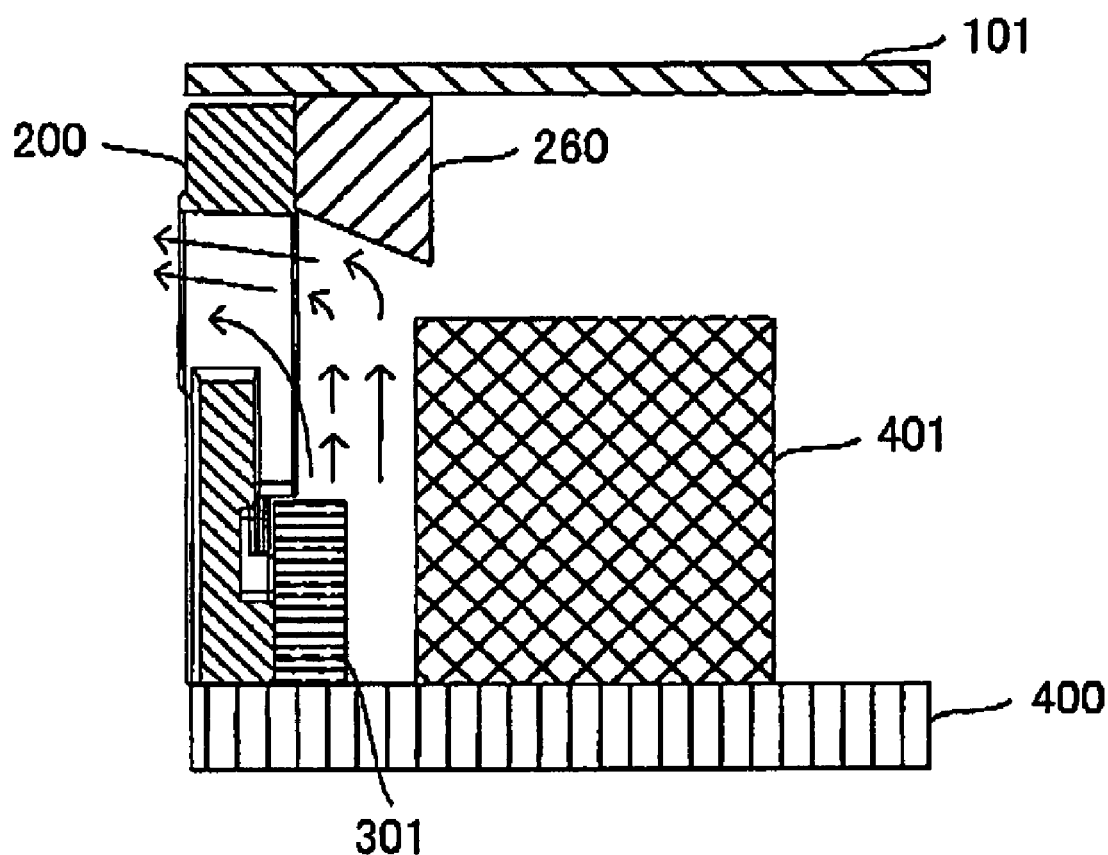
FIG. 11 is a schematic view showing a protrusion hung from a top plate of the case.

In the aforementioned embodiment, the visor-like protrusion 260 is provided above the through holes 202 formed in the surface of the heat sink 200. The visor-like protrusion 260 may be hung from the top plate 101 of the case as shown in FIG. 11. The bottom 261 of the protrusion 260 is also sloped to rise from the inside to the outside the case. The protrusion 260 may be fixed to the top plate 101 of the case through adhesion, welding, soldering, or screwing, or may be integrally formed with the top plate 101 of the case through the press working. The provision of the visor-like protrusion 260 hung from the top plate 101 of the case makes it possible to easily radiate the heat generated by the heat generating element outside the case.

The present invention is not limited to the embodiment as described above, and within the spirit and scope of the present invention, various modifications and alterations can be made.

What is claimed is:

1. An electronic device comprising: a heat generating element disposed on a substrate; and a radiation member disposed perpendicularly to a bottom of a case and adjacent to a side plate of the case having two vent holes, which includes: a groove vertically extending upward from a lower portion, and through holes formed in a position corresponding to the vent holes of the side plate of the case and at an upper portion along the groove, wherein: the radiation member is provided such that one of the groove and one of the through holes are provided above the heat generating element, and a visor-like protrusion, sloped to fall as the visor-like protrusion extends in the direction of the interior of the case, is provided above the heat generating element at an upper portion of the one of the through holes, and is hung from a top plate of the case, the radiation member further includes two protrusions that fit with the vent holes formed in the side plate of the case and the through holes are formed in the protrusions.

2. The electronic device according to claim 1, wherein the radiation member further includes the groove on a surface opposite a surface on which the heat generating element is provided.

3. The electronic device according to claim 1, wherein the heat radiation member has an inner circumferential surface of the through holes that is sloped such that an inner diameter of the holes is increased from the inside to the outside of the case.

4. The electronic device according to claim 1, wherein the radiation member has plural grooves.

5. The electronic device according to claim 1, wherein a ventilation device is attached to one of the side plate and a back plate of the case.

* * * * *

UNITED STATES PATENT AND TRADEMARK OFFICE
CERTIFICATE OF CORRECTION

PATENT NO. : 7,881,056 B2  
APPLICATION NO. : 11/987634  
DATED : February 1, 2011  
INVENTOR(S) : Tetsuo Sano It is certified that error appears in the above-identified patent and that said Letters Patent is hereby corrected as shown below:

Please delete the following:

"(73) Assignee: Fujitsu Ten, Kobe-shi (JP)"

and replace with:

(73) Assignee: Fujitsu Ten Limited, Kobe-shi (JP)

Signed and Sealed this  
Eleventh Day of September, 2012

David J. Kappos  
*Director of the United States Patent and Trademark Office*